United States Patent [19]
Gardner et al.

[11] Patent Number: 5,648,286
[45] Date of Patent: Jul. 15, 1997

[54] METHOD OF MAKING ASYMMETRICAL TRANSISTOR WITH LIGHTLY DOPED DRAIN REGION, HEAVILY DOPED SOURCE AND DRAIN REGIONS, AND ULTRA-HEAVILY DOPED SOURCE REGION

[75] Inventors: Mark I. Gardner, Cedar Creek; H. Jim Fulford, Jr.; Derick J. Wristers, both of Austin, all of Tex.

[73] Assignee: Advanced Micro Devices, Inc., Sunnyvale, Calif.

[21] Appl. No.: 711,383

[22] Filed: Sep. 3, 1996

[51] Int. Cl.$^6$ ................................................. H01L 21/265
[52] U.S. Cl. ...................................... 437/44; 437/41
[58] Field of Search ........................ 437/40, 41, 44

[56] References Cited

U.S. PATENT DOCUMENTS

| | | | |
|---|---|---|---|
| 5,286,664 | 2/1994 | Horiuchi | 437/44 |
| 5,424,229 | 6/1995 | Oyamatsu | 437/35 |
| 5,547,885 | 8/1996 | Ogoh | 437/44 |
| 5,578,509 | 11/1996 | Fujita | 437/41 |

FOREIGN PATENT DOCUMENTS

| | | |
|---|---|---|
| 0187016 | 7/1986 | European Pat. Off. . |
| 0027269 | 1/1989 | Japan . |
| 0310931 | 12/1990 | Japan . |

*Primary Examiner*—John Niebling
*Assistant Examiner*—Michael S. Lebentritt
*Attorney, Agent, or Firm*—Skjerven, Morrill, MacPherson, Franklin & Friel; David M. Sigmond

[57] ABSTRACT

An asymmetrical IGFET including a lightly doped drain region, heavily doped source and drain regions, and an ultra-heavily doped source region is disclosed. Preferably, the lightly doped drain region and heavily doped source region provide channel junctions. A method of making the IGFET includes providing a semiconductor substrate, forming a gate with first and second opposing sidewalls over the substrate, applying a first ion implantation to implant lightly doped source and drain regions into the substrate, applying a second ion implantation to convert the lightly doped source region into a heavily doped source region without doping the lightly doped drain region, forming first and second spacers adjacent to the first and second sidewalls, respectively, and applying a third ion implantation to convert a portion of the heavily doped source region outside the first spacer into an ultra-heavily doped source region without doping a portion of the heavily doped source region beneath the first spacer, and to convert a portion of the lightly doped drain region outside the second spacer into a heavily doped drain region without doping a portion of the lightly doped drain region beneath the second spacer. Advantageously, the IGFET has low source-drain series resistance and reduces hot carrier effects.

18 Claims, 3 Drawing Sheets

METHOD OF MAKING ASYMMETRICAL TRANSISTOR WITH LIGHTLY DOPED DRAIN REGION, HEAVILY DOPED SOURCE AND DRAIN REGIONS, AND ULTRA-HEAVILY DOPED SOURCE REGION

CROSS REFERENCE TO RELATED APPLICATIONS

This application is related to U.S. application Ser. No. 08/682,238, filed Jul. 17, 1996, entitled "Method For Fabrication Of A Non-Symmetrical Transistor" by Gardner et al.; and related to U.S. application Ser. No. 08/682,493, filed Jul. 17, 1996, entitled "Method For Fabrication Of A Non-Symmetrical Transistor" by Gardner et al.

BACKGROUND OF THE INVENTION

1. Field of the Invention

The present invention relates to integrated circuit manufacturing, and more particularly to insulated-gate field-effect transistors.

2. Description of Related Art

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in the channel in order to modulate the longitudinal conductance of the channel.

In typical IGFET processing, the source and drain are formed by introducing dopants of second conductivity type (P or N) into a semiconductor substrate of first conductivity type (N or P) using a patterned gate as a mask. This self-aligning procedure tends to improve packing density and reduce parasitic overlap capacitances between the gate and the source and drain.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anisotropically etched to provide a gate which provides a mask during formation of the source and drain by ion implantation. Thereafter, a drive-in step is applied to repair crystalline damage and to drive-in and activate the implanted dopant.

As IGFET dimensions are reduced and the supply voltage remains constant (e.g., 3 V), the electric field in the channel near the drain tends to increase. If the electric field becomes strong enough, it can give rise to so-called hot-carrier effects. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

A number of techniques have been utilized to reduce hot carrier effects. One such technique is a lightly doped drain (LDD). The LDD reduces hot carrier effects by reducing the maximum lateral electric field. The drain is typically formed by two ion implants. A light implant is self-aligned to the gate, and a heavy implant is self-aligned to the gate on which sidewall spacers have been formed. The spacers are typically oxides or nitrides. The purpose of the lighter first dose is to form a lightly doped region of the drain (or LDD) at the edge near the channel. The second heavier dose forms a low resistivity heavily doped region of the drain, which is subsequently merged with the lightly doped region. Since the heavily doped region is farther away from the channel than a conventional drain structure, the depth of the heavily doped region can be made somewhat greater without adversely affecting the device characteristics. The lightly doped region is not necessary for the source (unless bidirectional current is used), however lightly doped regions are typically formed for both the source and drain to avoid additional processing steps.

Disadvantages of LDDs include increased fabrication complexity and increased parasitic resistance due to their light doping levels. During operation, LDD parasitic resistance decreases drain current. Linear drain current (i.e., drain current in the linear or triode region) is reduced by the parasitic resistance in both the source and drain. Saturation drain current (i.e., drain current in the saturation region) is largely unaffected by the parasitic resistance of the drain but greatly reduced by the parasitic resistance of the source. Therefore, saturation drain current can be improved while reducing hot carrier effects by providing a lightly doped region only on the drain side. That is, the drain includes lightly and heavily doped regions, and the entire source is heavily doped.

Asymmetrical IGFETs (with asymmetrically doped sources and drains) are known in the art. For instance, U.S. Pat. No. 5,424,229 entitled "Method For Manufacturing MOSFET Having An LDD Structure" by Oyamatsu discloses providing a mask with an opening over a substrate, implanting a dopant through the opening at an angle to the substrate to form a lightly doped drain region on one side without a corresponding source region on the other side, forming a gate in the opening which overlaps the lightly doped drain region, removing the mask, and implanting heavily doped source and drain regions using the gate as an implant mask. As another example, U.S. Pat. No. 5,286,664 entitled "Method For Fabricating The LDD-MOSFET" by Horiuchi discloses forming a gate, implanting lightly doped source and drain regions using the gate as an implant mask, forming a photoresist layer that covers the source side and exposes the drain side, depositing a single spacer on the drain side using liquid phase deposition (LPD) of silicon dioxide, stripping the photoresist, and implanting heavily doped source and drain regions using the gate and single spacer as an implant mask.

A drawback to these and other conventional asymmetrical IGFETs is that the heavily doped source and drain regions typically have identical dopant concentrations. Although the doping concentration of the heavily doped drain region may be constrained in order to reduce hot carrier effects, the doping concentration of the heavily doped source region need not be constrained in this manner. Furthermore, increasing the doping concentration of the heavily doped source region reduces the source-drain series resistance, thereby improving drive current.

Accordingly, a need exists for an improved asymmetrical IGFET which reduces both source-drain series resistance and hot carrier effects.

SUMMARY OF THE INVENTION

The present invention provides an asymmetrical IGFET with a lightly doped drain region, heavily doped source and drain regions, and an ultra-heavily doped source region. Preferably, the lightly doped drain region and the heavily doped source region provide channel junctions, and the heavily doped drain region and the ultra-heavily doped source region are spaced from the channel junctions. Advantageously, the IGFET has low source-drain series resistance and reduces hot carrier effects.

By definition, the dopant concentration of the ultra-heavily doped source region exceeds that of the heavily doped source and drain regions, and the dopant concentration of the heavily doped source and drain regions exceeds that of the lightly doped drain region. Furthermore, the heavily doped source and drain regions need not have similar dopant concentrations.

Preferably, the IGFET includes a source that consists of the heavily doped and ultra-heavily doped source regions, and a drain that consists of the lightly doped and heavily doped drain regions. It is also preferred that the dopant concentration of the ultra-heavily doped source region is in the range of 1.5 to 10 times that of the heavily doped source and drain regions, and the dopant concentration of the heavily doped source and drain regions is in the range of 10 to 100 times that of the lightly doped drain region, and furthermore that the dopant concentration of the lightly doped drain region is in the range of about $1\times10^{17}$ to $5\times10^{18}$ atoms/cm$^3$, the dopant concentration of the heavily doped source and drain regions is in the range of about $1\times10^{19}$ to $1\times10^{20}$ atoms/cm$^3$, and the dopant concentration of the ultra-heavily doped source region is in the range of about $1.5\times10^{19}$ to $1\times10^{21}$ atoms/cm$^3$.

In accordance with another aspect of the invention, a method of making the IGFET includes providing a semiconductor substrate, forming a gate with first and second opposing sidewalls over the substrate, applying a first ion implantation to implant lightly doped source and drain regions into the substrate, applying a second ion implantation to convert the lightly doped source region into a heavily doped source region without doping the lightly doped drain region, forming first and second spacers adjacent to the first and second sidewalls, respectively, and applying a third ion implantation to convert a portion of the heavily doped source region outside the first spacer into an ultra-heavily doped source region without doping a portion of the heavily doped source region beneath the first spacer, and to convert a portion of the lightly doped drain region outside the second spacer into a heavily doped drain region without doping a portion of the lightly doped drain region beneath the second spacer.

Preferably, the method includes applying the first ion implantation using the gate as an implant mask, providing a photoresist layer with an opening above a first portion of the gate and the lightly doped source region while the photoresist layer covers a second portion of the gate and the lightly doped drain region, applying the second ion implantation using the photoresist layer and the first portion of the gate as an implant mask, stripping the photoresist layer, forming the spacers, and applying the third ion implantation using the gate and the spacers as an implant mask.

These and other aspects, features and advantages of the invention will be further described and more readily apparent from a review of the detailed description of the preferred embodiments which follow.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
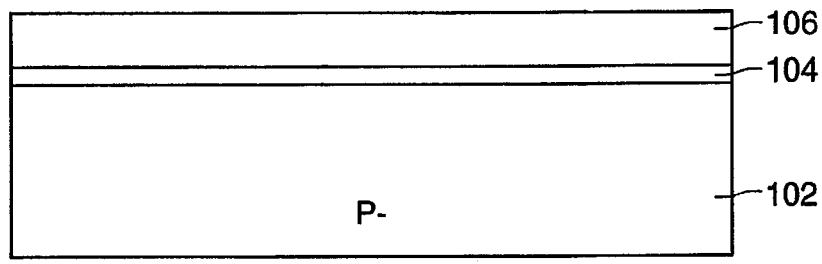
FIGS. 1A–1I show cross-sectional views of successive process steps for making an asymmetrical IGFET with a lightly doped drain region, heavily doped source and drain regions, and an ultra-heavily doped source region in accordance with an embodiment of the invention.

In the drawings, depicted elements are not necessarily drawn to scale and like or similar elements may be designated by the same reference numeral throughout the several views.

In FIG. 1A, silicon substrate 102 suitable for integrated circuit manufacture includes P-type epitaxial layer with a boron background concentration on the order of $1\times10^{16}$ atoms/cm$^3$, a <100> orientation and a resistivity of 12 ohm-cm. Preferably, the epitaxial surface layer is disposed on a P+ base layer (not shown) and includes a planar top surface. Gate oxide 104, composed of silicon dioxide (SiO$_2$), is formed on the top surface of substrate 102 using tube growth at a temperature of 700° to 1000° C. in an O$_2$ containing ambient. Gate oxide 104 has a thickness of 50 angstroms. Thereafter, a blanket layer of undoped polysilicon 106 is deposited by low pressure chemical vapor deposition (LPCVD) on the top surface of gate oxide 104. Polysilicon 106 has a thickness of 2000 angstroms. If desired, polysilicon 106 can be doped in situ as deposition occurs, or doped before a subsequent etch step by implanting arsenic with a dosage in the range of $1\times10^{15}$ to $5\times10^{15}$ atoms/cm$^2$ and an energy in the range of 2 to 80 kiloelectron-volts. However, it is generally preferred that polysilicon 106 be doped during an implantation step following a subsequent etch step.

Figure 1B:
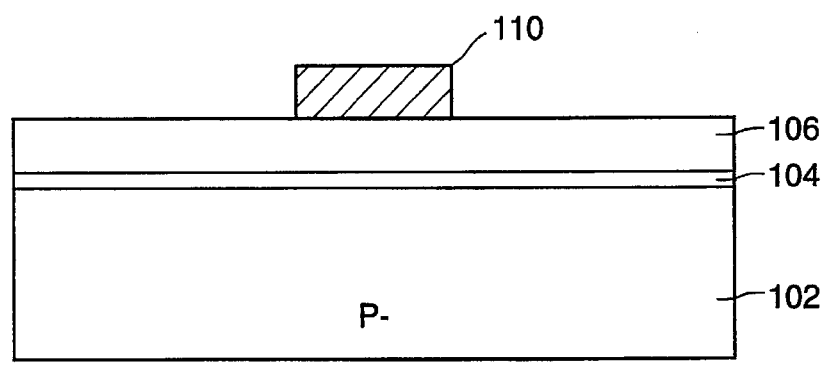

In FIG. 1B, photoresist 110 is deposited as a continuous layer on polysilicon 106 and selectively irradiated using a photolithographic system, such as a step and repeat optical projection system, in which I-line ultraviolet light from a mercury-vapor lamp is projected through a first reticle and a focusing lens to obtain a first image pattern. Thereafter, photoresist 110 is developed and the irradiated portions are removed to provide openings in photoresist 110. The openings expose portions of polysilicon 106, thereby defining a gate.

Figure 1C:
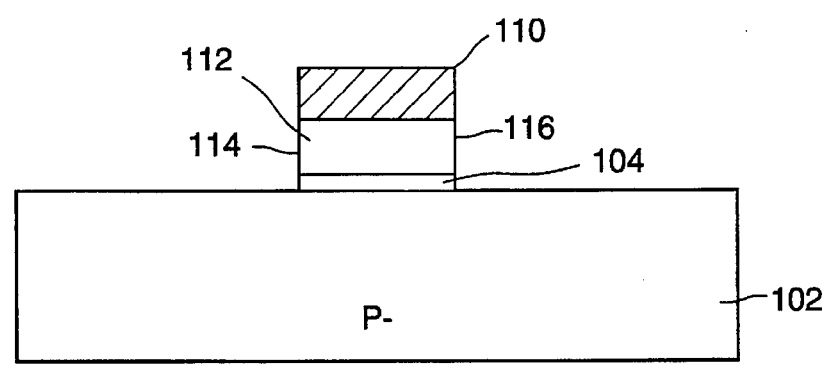

In FIG. 1C, an anisotropic etch is applied that removes the exposed portions of polysilicon 106 and the underlying portions of gate oxide 104. Preferably, a first dry etch is applied that is highly selective of polysilicon, and a second dry etch is applied that is highly selective of silicon dioxide, using photoresist 110 as an etch mask. After etching occurs, the remaining portion of polysilicon 106 provides polysilicon gate 112 with opposing vertical sidewalls 114 and 116. Polysilicon gate 112 has a length (between sidewalls 114 and 116) of 3500 angstroms.

Figure 1D:
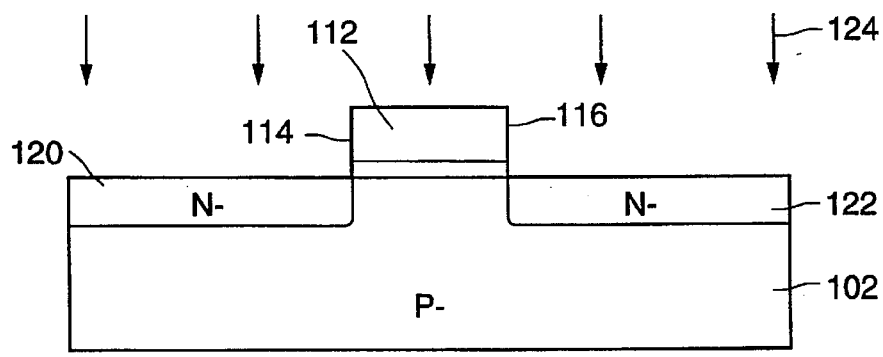

In FIG. 1D, photoresist 110 is stripped, and lightly doped source and drain regions 120 and 122 are implanted into substrate 102 by subjecting the structure to ion implantation of phosphorus, indicated by arrows 124, at a dose in the range of $1\times10^{13}$ to $5\times10^{14}$ atoms/cm$^2$ and an energy in the range of 2 to 35 kiloelectron-volts. Polysilicon gate 112 provides an implant mask for the underlying portion of substrate 102. As a result, lightly doped source and drain regions 120 and 122 are substantially aligned with sidewalls 114 and 116, respectively. Lightly doped source and drain regions 120 and 122 are doped N– with a phosphorus concentration in the range of about $1\times10^{17}$ to $5\times10^{18}$ atoms/cm$^3$.

Figure 1E:
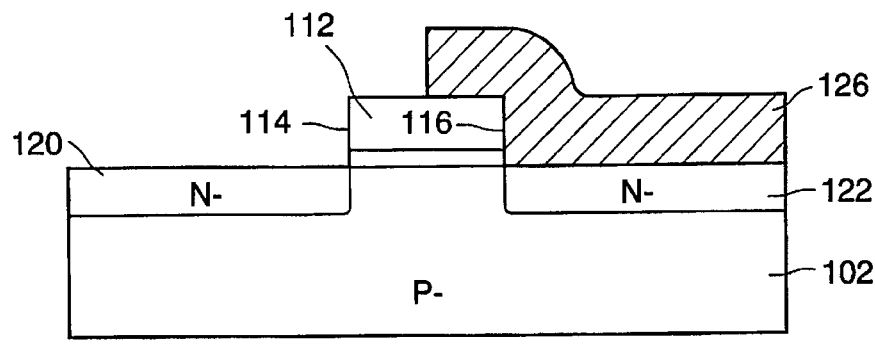

In FIG. 1E, photoresist 126 is deposited as a continuous layer over substrate 102 and selectively irradiated using the photolithographic system and a second reticle to obtain a second image pattern, and the irradiated portions are removed to provide an opening in photoresist 126. The opening exposes lightly doped source region 120, sidewall 114 and a first portion of polysilicon gate 112 adjacent to sidewall 114, whereas photoresist 126 covers lightly doped drain region 122, sidewall 116 and a second portion of polysilicon gate 112 adjacent to second sidewall 116.

Figure 1F:
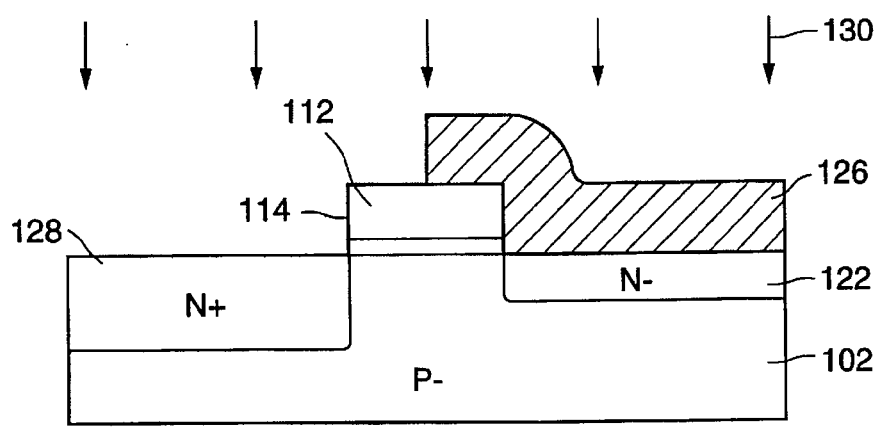

In FIG. 1F, lightly doped source region 120 is converted into heavily doped source region 128 by subjecting the structure to ion implantation of arsenic, indicated by arrows 130, at a dose of $4.5 \times 10^{15}$ atoms/cm$^2$ and an energy in the range of 10 to 80 kiloelectron-volts. Photoresist 126 and the first portion of polysilicon gate 112 (outside photoresist 126) provide an implant mask for the underlying portion of substrate 102. As a result, heavily doped source region 128 is substantially aligned with sidewall 114, and lightly doped drain region 122 is essentially unaffected. Heavily doped source region 128 is doped N+ with an arsenic concentration in the range of about $1 \times 10^{19}$ to $1 \times 10^{20}$ atoms/cm$^3$. Preferably, the dopant concentration of heavily doped source region 128 is at least 10 times that of lightly doped drain region 122.

Figure 1G:
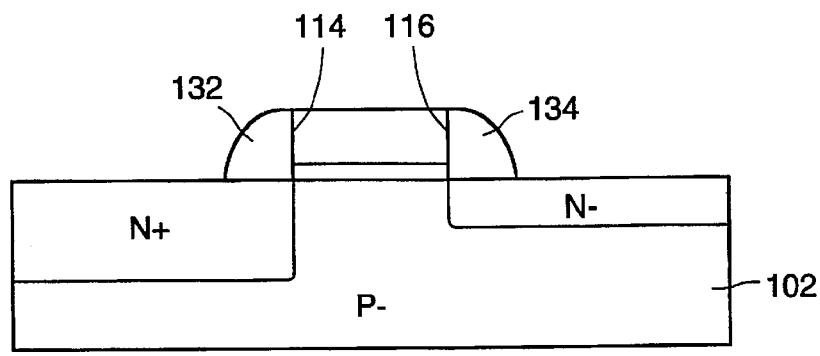

In FIG. 1G, photoresist 126 is stripped, and a blanket layer of silicon dioxide with a thickness of 2500 angstroms is conformally deposited over the exposed surfaces by CVD at a temperature in the range of 300° to 400° C. Thereafter, the structure is subjected to an anisotropic etch, such as a reactive ion etch, that is highly selective of silicon dioxide to form oxide spacers 132 and 134 adjacent to sidewalls 114 and 116, respectively. Oxide spacers 132 and 134 each extend 1200 angstroms across substrate 102.

Figure 1H:
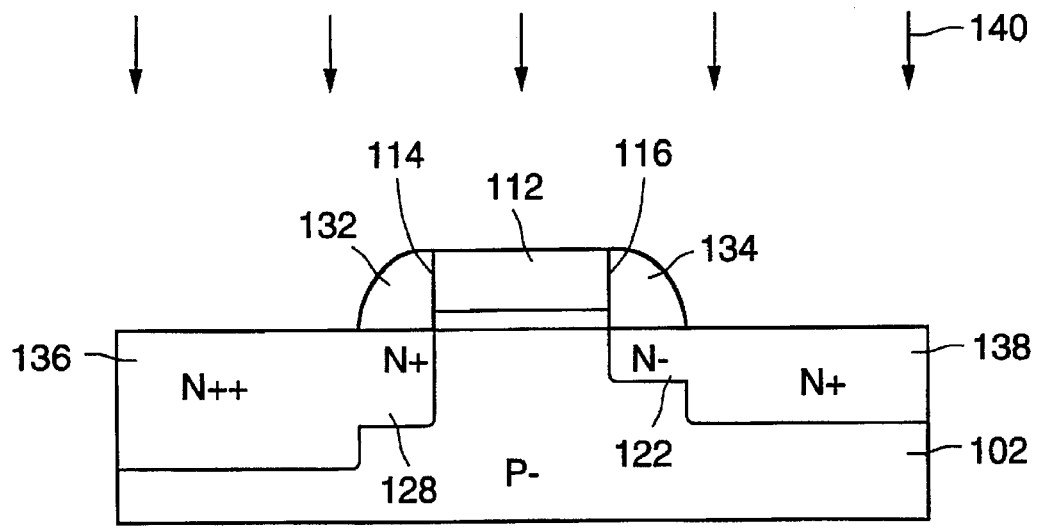

In FIG. 1H, a portion of heavily doped source region 128 outside oxide spacer 132 is converted into ultra-heavily doped source region 136, and a portion of lightly doped drain region 122 outside oxide spacer 134 is converted into heavily doped drain region 138 by subjecting the structure to ion implantation of arsenic, indicated by arrows 140, at a dose in the range of $2 \times 10^{15}$ to $3 \times 10^{15}$ atoms/cm$^2$ and an energy in the range of 20 to 80 kiloelectron-volts. Polysilicon gate 112 and oxide spacers 132 and 134 provide an implant mask for the underlying portion of substrate 102. As a result, ultra-heavily doped source region 136 is substantially aligned with oxide spacer 132 on the side opposite sidewall 114, and heavily doped drain region 138 is substantially aligned with oxide spacer 134 on the side opposite sidewall 116. Furthermore, the portion of heavily doped source region 128 beneath oxide spacer 132 and the portion of lightly doped drain region 122 beneath oxide spacer 134 are essentially unaffected. Ultra-heavily doped source region 136 is doped N++ with an arsenic concentration in the range of about $1.5 \times 10^{19}$ to $1 \times 10^{21}$ atoms/cm$^3$, and heavily doped drain region 138 is doped N+ with an arsenic concentration in the range of about $1 \times 10^{19}$ to $1 \times 10^{20}$ atoms/cm$^3$. Preferably, the dopant concentration of ultra-heavily doped source region 136 is at least 1.5 times that of heavily doped source region 128 and heavily doped drain region 138.

Figure 1I:
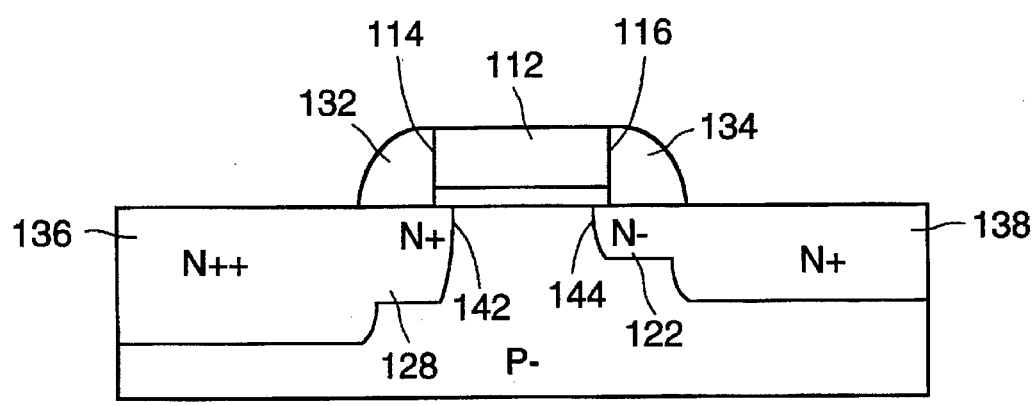

In FIG. 1I, a rapid thermal anneal on the order of 900° to 1050° C. for 10 to 30 seconds is applied to remove crystalline damage and to drive-in and activate the implanted dopants. As a result, heavily doped source region 128 and ultra-heavily doped source region 136 merge to form a source, and lightly doped drain region 122 and heavily doped drain region 138 merge to form a drain for an NMOS device controlled by polysilicon gate 112. Since the dopants diffuse both vertically and laterally during the anneal, heavily doped source region 128 and lightly doped drain region 122 extend slightly beneath sidewalls 114 and 116, respectively, and ultra-heavily doped source region 136 and heavily doped drain region 138 extend slightly beneath oxide spacers 132 and 134, respectively. As is seen, heavily doped source region 128 provides a first channel junction 142 that is substantially aligned with sidewall 114, and lightly doped drain region 122 provides a second channel junction 144 that is substantially aligned with sidewall 116. In addition, ultra-heavily doped source region 136 and heavily doped drain region 138 are spaced from channel junctions 142 and 144.

Further processing steps in the fabrication of IGFETs typically include forming salicide contacts on the gate, source and drain, forming a thick oxide layer over the active region, forming contact windows in the oxide layer to expose the salicide contacts, forming interconnect metallization in the contact windows, and forming a passivation layer over the interconnect metallization. In addition, earlier or subsequent high-temperature process steps can be used to supplement or replace the desired anneal, activation, and drive-in functions. These further processing steps are conventional and need not be repeated herein. Likewise the principal processing steps disclosed herein may be combined with other steps apparent to those skilled in the art.

The present invention includes numerous variations to the embodiment described above. For instance, the gate oxide can remain outside the gate until oxide spacers are formed, and forming silicon nitride ($Si_3N_4$) spacers instead of oxide spacers allows the gate oxide to remain outside the gate after the spacers are formed. If desired, the masking layer that defines the gate can remain in place when the lightly doped source and drain regions are implanted. The spacers may include several layers of sequentially grown or deposited materials, of which only one layer need be subjected to the anisotropic etch. The gate can be various conductors, and the gate insulator and spacers and can be various dielectrics including silicon dioxide, silicon nitride and silicon oxynitride. The source may include a very small lightly doped source region adjacent to the first channel junction as long as the lightly doped source region, if any, is far smaller than the lightly doped drain region. Suitable N-type dopants include arsenic, phosphorus and combinations thereof. Alternatively, if a P-channel device is desired, suitable P-type dopants include boron, boron species (such as boron difluoride) and combinations thereof.

Further details regarding asymmetrical IGFETs are disclosed in U.S. application Ser. No. 08/711,382 filed concurrently herewith, entitled "Asymmetrical Transistor With Lightly and Heavily Doped Drain Regions and Ultra-Heavily Doped Source Region" by Kadosh et al.; U.S. application Ser. No. 08/711,381 filed concurrently herewith, entitled "Asymmetrical N-Channel and P-Channel Devices" by Kadosh et al.; and U.S. application Ser. No. 08/711,957 filed concurrently herewith, entitled "Asymmetrical N-Channel and Symmetrical P-Channel Devices" by Gardner et al.; the disclosures of which are incorporated herein by reference.

The invention is particularly well-suited for fabricating N-channel MOSFETs, P-channel MOSFETs, and other types of IGFETs, particularly for high-performance microprocessors where high circuit density is essential. Although only a single device has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of making an asymmetrical IGFET, comprising the steps of:

providing a semiconductor substrate;

forming a gate with first and second opposing sidewalls over the substrate;

applying a first ion implantation to implant lightly doped source and drain regions into the substrate;

applying a second ion implantation to convert substantially all of the lightly doped source region into a heavily doped source region without doping the lightly doped drain region;

forming first and second spacers adjacent to the first and second sidewalls, respectively;

applying a third ion implantation to convert a portion of the heavily doped source region outside the first spacer into an ultra-heavily doped source region without doping a portion of the heavily doped source region beneath the first spacer, and to convert a portion of the lightly doped drain region outside the second spacer into a heavily doped drain region without doping a portion of the lightly doped drain region beneath the second spacer; and forming a source and a drain, wherein the source includes the heavily doped and ultra-heavily doped source regions, and the drain includes the lightly doped and heavily doped drain regions.

2. The method of claim 1, wherein the source consists of the heavily doped and ultra-heavily doped source regions, and the drain consists of the lightly doped and heavily doped drain regions.

3. The method of claim 2, wherein the heavily doped and ultra-heavily doped source regions and the lightly doped and heavily doped drain regions extend to a top surface of the substrate.

4. The method of claim 1, wherein a dopant concentration of the heavily doped source and drain regions is at least 10 times that of the lightly doped drain region, and a dopant concentration of the ultra-heavily doped source region is at least 1.5 times that of the heavily doped source and drain regions.

5. The method of claim 4, wherein the dopant concentration of the lightly doped drain region is in the range of about $1 \times 10^{17}$ to $5 \times 10^{18}$ atoms/cm$^3$, the dopant concentration of the heavily doped source and drain regions is in the range of about $1 \times 10^{19}$ to $1 \times 10^{20}$ atoms/cm$^3$, and the dopant concentration of the ultra-heavily doped source region is in the range of about $1.5 \times 10^{19}$ to $1 \times 10^{21}$ atoms/cm$^3$.

6. The method of claim 1, including applying the first ion implantation using the gate as an implant mask.

7. The method of claim 1, including:

forming a masking layer over the substrate after applying the first ion implantation, wherein the masking layer includes an opening above the lightly doped source region, the first sidewall and a first portion of the gate adjacent to the first sidewall, and the masking layer covers the lightly doped drain region, the second sidewall and a second portion of the gate adjacent to the second sidewall; and applying the second ion implantation using the masking layer and the first portion of the gate as an implant mask.

8. The method of claim 1, including applying the third ion implantation using the gate and the spacers as an implant mask.

9. A method of making an asymmetrical IGFET, comprising the steps of:

providing a semiconductor substrate;

forming a gate insulator on the substrate;

forming a gate with first and second opposing sidewalls on the gate insulator;

applying a first ion implantation to implant lightly doped source and drain regions into the substrate and substantially aligned with the first and second sidewalls, respectively;

forming a masking layer over the substrate, wherein the masking layer includes an opening above the lightly doped source region, the first sidewall and a first portion of the gate adjacent to the first sidewall, and the masking layer covers the lightly doped drain region, the second sidewall and a second portion of the gate adjacent to the second sidewall;

applying a second ion implantation through the opening to convert the lightly doped source region into a heavily doped source region without doping the lightly doped drain region, wherein a dopant concentration of the heavily doped source region exceeds that of the lightly doped drain region;

stripping the masking layer;

forming first and second spacers adjacent to the first and second sidewalls, respectively;

applying a third ion implantation to convert a portion of the heavily doped source region outside the first spacer into an ultra-heavily doped source region without doping a portion of the heavily doped source region beneath the first spacer, and to convert a portion of the lightly doped drain region outside the second spacer into a heavily doped drain region without doping a portion of the lightly doped drain region beneath the second spacer, wherein a dopant concentration of the ultra-heavily doped source region exceeds that of the heavily doped source and drain regions, and a dopant concentration of the heavily doped drain region exceeds that of the lightly doped drain region; and forming a source and a drain, wherein the source includes the heavily doped and ultra-heavily doped source regions, and the drain includes the lightly doped and heavily doped drain regions.

10. The method of claim 9, including:

applying the first ion implantation using the gate as an implant mask;

applying the second ion implantation using the masking layer and the first portion of the gate as an implant mask; and applying the third ion implantation using the gate and the spacers as an implant mask.

11. The method of claim 9, wherein the dopant concentration of the lightly doped drain region is in the range of about $1\times10^{17}$ to $5\times10^{18}$ atoms/cm$^3$, the dopant concentration of the heavily doped source and drain regions is in the range of about $1\times10^{19}$ to $1\times10^{20}$ atoms/cm$^3$, and the dopant concentration of the ultra-heavily doped source region is in the range of about $1.5\times10^{19}$ to $1\times10^{21}$ atoms/cm$^3$.

12. The method of claim 9, wherein the gate is polysilicon and the gate insulator is silicon dioxide.

13. The method of claim 9, wherein the masking layer is photoresist.

14. The method of claim 9, wherein forming the spacers includes depositing a blanket layer of silicon dioxide over the substrate, and then applying a reactive ion etch.

15. The method of claim 9, wherein the first and second channel junctions are substantially aligned with the first and second sidewalls, respectively.

16. The method of claim 9, wherein the substrate is P-type and the ion implantations implant N-type dopants.

17. The method of claim 9, wherein the substrate is N-type and the ion implantations implant P-type dopants.

18. A method of making an asymmetrical IGFET, comprising the following steps in the sequence set forth:

providing a semiconductor substrate of first conductivity type;

forming a gate oxide on the substrate;

forming a polysilicon gate with first and second opposing sidewalls on the gate oxide;

applying a first ion implantation using the polysilicon gate as an implant mask to implant lightly doped source and drain regions of second conductivity type into the substrate and substantially aligned with the first and second sidewalls, respectively;

forming a photoresist layer over the substrate, wherein the photoresist layer includes an opening above the lightly doped source region, the first sidewall and a first portion of the polysilicon gate adjacent to the first sidewall, and the photoresist layer covers the lightly doped drain region, the second sidewall and a second portion of the polysilicon gate adjacent to the second sidewall;

applying a second ion implantation using the photoresist layer and the first portion of the polysilicon gate as an implant mask to convert the lightly doped source region into a heavily doped source region of second conductivity type without doping the lightly doped drain region;

stripping the photoresist layer;

depositing a blanket layer of insulative spacer material over the substrate and then applying an anisotropic etch to form first and second spacers adjacent to the first and second sidewalls, respectively; and applying a third ion implantation using the polysilicon gate and the spacers as an implant mask to convert a portion of the heavily doped source region outside the first spacer into an ultra-heavily doped source region of second conductivity type without doping a portion of the heavily doped source region beneath the first spacer, and to convert a portion of the lightly doped drain region outside the second spacer into a heavily doped drain region of second conductivity type without doping a portion of the lightly doped drain region beneath the second spacer;

wherein a source includes the heavily doped and ultra-heavily doped source regions, a drain includes the lightly doped and heavily doped drain regions, the source provides a first channel junction, the lightly doped drain region provides a second channel junction, the ultra-heavily doped source region is spaced from the first channel junction, and the heavily doped drain region is spaced from the second channel junction.

* * * * *